(12) United States Patent
Kwon

(10) Patent No.: US 10,332,598 B2
(45) Date of Patent: Jun. 25, 2019

(54) BLOCK DECODER AND SEMICONDUCTOR MEMORY DEVICE HAVING THE SAME

(71) Applicant: SK hynix Inc., Gyeonggi-do (KR)

(72) Inventor: Tae Heui Kwon, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 20 days.

(21) Appl. No.: 15/398,140

(22) Filed: Jan. 4, 2017

(65) Prior Publication Data
US 2017/0330625 A1  Nov. 16, 2017

(30) Foreign Application Priority Data

May 13, 2016 (KR) .................. 10-2016-0058709

(51) Int. Cl.
*G11C 16/08* (2006.01)
*G11C 8/08* (2006.01)
*G11C 16/04* (2006.01)

(52) U.S. Cl.
CPC ............. *G11C 16/08* (2013.01); *G11C 8/08* (2013.01); *G11C 16/0483* (2013.01)

(58) Field of Classification Search
CPC ....................................... G11C 16/08
USPC ....................................... 365/185.11
See application file for complete search history.

(56) References Cited

U.S. PATENT DOCUMENTS

| 2005/0013166 A1* | 1/2005 | Chen | G11C 8/08 |
| | | | 365/185.03 |
| 2010/0182835 A1* | 7/2010 | Chung | G11C 8/10 |
| | | | 365/185.11 |
| 2013/0215702 A1* | 8/2013 | Chu | G11C 8/12 |
| | | | 365/230.03 |

FOREIGN PATENT DOCUMENTS

| KR | 101024125 | 3/2011 |
| KR | 1020120013083 | 2/2012 |

* cited by examiner

*Primary Examiner* — Huan Hoang
*Assistant Examiner* — Muna A Techane
(74) *Attorney, Agent, or Firm* — IP & T Group LLP

(57) ABSTRACT

There are provided a block decoder including a control signal generating circuit suitable for generating a control signal in response to address signals, a potential level switch circuit suitable for outputting an internal voltage having an internal power potential level or a negative potential level in response to the control signal, and a voltage apply circuit suitable for outputting a block selecting signal having a high potential level higher than the internal power potential level in response to the control signal and the internal voltage having the internal power potential level, or outputting the internal voltage having the negative potential level as the block selecting signal in response to the control signal.

5 Claims, 5 Drawing Sheets

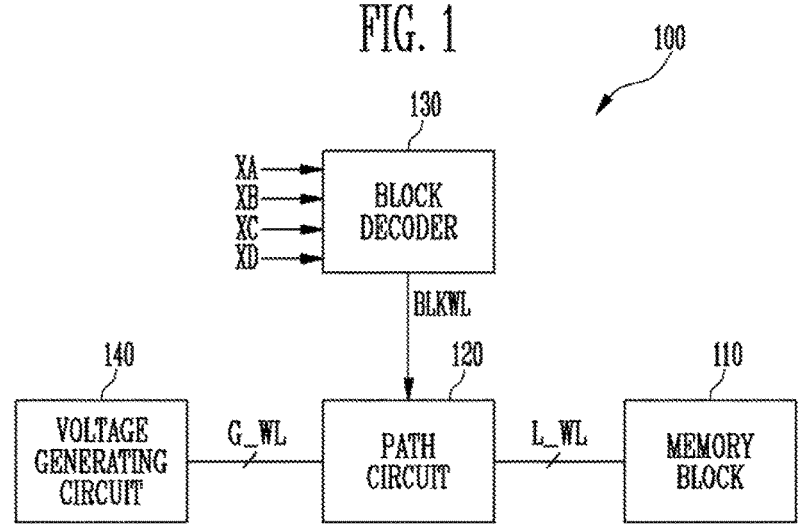
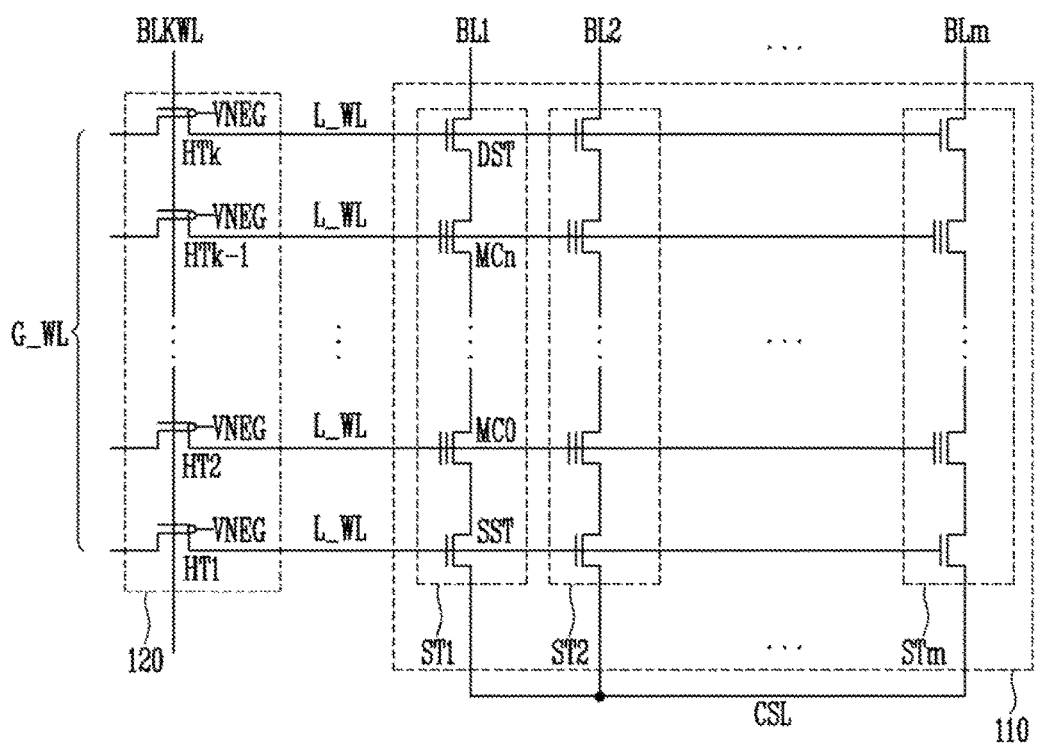

BLOCK DECODER AND SEMICONDUCTOR MEMORY DEVICE HAVING THE SAME

CROSS-REFERENCE TO RELATED APPLICATION

The present application claims priority under 35 U.S.C. 119(a) to Korean patent application number 10-2016-0058709 filed on May 13, 2016, which is incorporated herein by reference in its entirety.

BACKGROUND

1. Field

An aspect of the present disclosure relates generally to an electronic device and, more particularly to a block decoder and a semiconductor memory device including the same.

2. Description of the Related Art

A semiconductor device such as a semiconductor memory device may include one or more memory devices for storing data. The one or more memory devices may be volatile and/or non-volatile memory devices.

Generally, the operation speed of a write/read operation of a non-volatile memory device is slower than the operation speed of volatile memory device, however, a non-volatile memory device retains stored data even when power supply is blocked. Accordingly, a non-volatile memory device is used for storing data which need to be retained regardless of the power supply. Examples of a non-volatile memory device include a read only memory (ROM), a MROM (mask ROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), and a ferroelectric RAM (FRAM). Flash memories are categorized into NOR or NAND type flash memories.

A flash memory combines the advantages of relatively easier programming and deleting of the data of a RAM with the advantage of a ROM of retaining stored data even when the power supply is blocked. Flash memory has been widely used in portable and mobile electronic devices as storage media, for example, in digital cameras, personal digital assistants (PDA), and MP3 players.

Generally, a flash memory device employs a decoder capable of selecting a memory cell array by a block unit to perform a program operation, a read operation, and an erase operation to memory cells.

SUMMARY

Embodiments provide a block decoder of reduced size and a semiconductor memory device having the same.

According to an aspect of the present disclosure, there is provided a block decoder including a control signal generating circuit suitable for generating a control signal in response to address signals, a potential level switch circuit suitable for outputting an internal voltage having an internal power potential level or a negative potential level in response to the control signal, and a voltage apply circuit suitable for outputting a block selecting signal having a high potential level higher than the internal power potential level in response to the control signal and the internal voltage having the internal power potential level, or outputting the internal voltage having the negative potential level as the block selecting signal in response to the control signal.

According to an aspect of the present disclosure, there is provided a semiconductor memory device including a memory block, a voltage generating circuit suitable for generating a plurality of operating voltages and outputting the plurality of operating voltages to a plurality of word lines, a block decoder suitable for outputting a block selecting signal having one of a high potential level, which is higher than an internal power potential level, and a negative potential level in response to address signals, and a path circuit coupled between the voltage generating circuit and the memory block through the plurality of word lines, and suitable for selectively transmitting the plurality of operating voltages to the memory block in response to the block selecting signal, wherein the block decoder comprises a control signal generating circuit suitable for generating a control signal in response to the address signals, a potential level switch circuit suitable for outputting an internal voltage having an internal power potential level or the negative potential level in response to the control signal, and a voltage apply circuit suitable for outputting the block selecting signal having the high potential level in response to the control signal and the internal voltage having the internal power potential level, or outputting the Internal voltage having the negative potential level as the block selecting signal in response to the control signal.

BRIEF DESCRIPTION OF THE DRAWINGS

FIG. 1 is a block diagram illustrating a semiconductor memory device, according to an embodiment of the present disclosure.

FIG. 2 is a circuit diagram illustrating a memory block and a path circuit of the semiconductor memory device shown in FIG. 1.

DETAILED DESCRIPTION

Figure 3:
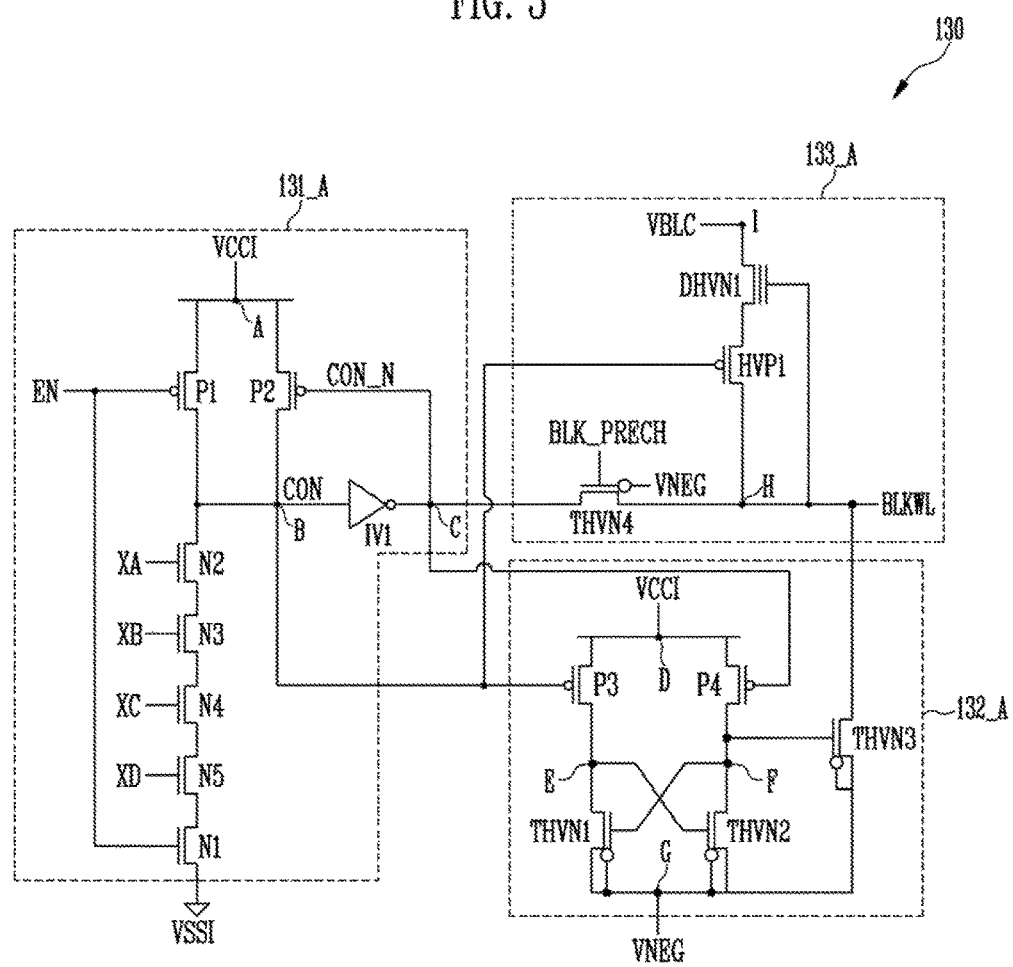
FIG. 3 is a circuit diagram illustrating a block decoder according to a first embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and related description are to be regarded as illustrative in nature and not restrictive.

In the entire specification, when an element is referred to as being "coupled" or "coupled" to another element, it can be directly coupled or coupled to the another element or be indirectly coupled or coupled to the another element with one or more intervening elements interposed therebetween.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor memory device 100, according to an embodiment of the present disclosure.

Referring to FIG. 1, the semiconductor memory device 100 may include a memory block 110, a path circuit 120, a block decoder 130 and a voltage generating circuit 140.

The memory block 110 may include a plurality of memory cells. For example, the plurality of memory cells may be non-volatile memory cells. The memory cells coupled to the same word line may be defined as a single page. In addition, the memory block 110 may include a plurality of cell strings. A local word line L_WL may be coupled between the memory block 110 and the path circuit 120.

The path circuit 120 may be coupled to the voltage generating circuit 140 through global word lines G_WL. The path circuit 120 may also be coupled to the memory block 110 through the local word lines L_WL. The path circuit 120 may transmit to the memory block 110 (also referred to simply as block 110) a plurality of operating voltages provided from the voltage generating circuit 140 in response to a block selecting signal BLKWL received from the block decoder 130. For example, during a read operation, the voltage generating circuit 140 may output a plurality of operating voltages including a read voltage having a negative potential level, and the path circuit 120 may transmit to the memory block 110 or block the operating voltages in response to the block selecting signal BLKWL. When the block selecting signal BLKWL having a high potential level that is higher than an internal power potential level is applied to the path circuit 120, the plurality of operating voltages including the read voltage having the negative potential level may be transmitted to the memory block 110 as a selected memory block. In addition, when the block selecting signal BLKWL having a negative potential level is applied to the path circuit 120, the path circuit 120 blocks the plurality of operating voltages including the read voltage having the negative potential level from being transferred to the memory block 110 since the memory block is not a selected memory block.

The block decoder 130 may output the block selecting signal BLKWL having the high potential level or the negative potential level in response to decoded address signals XA, XB, XC and XD. When the memory block 110 is a selected memory block, the block decoder 130 may output the block selecting signal BLKWL having the high potential level in response to decoded address signals XA, XB, XC and XD having a high logic level. In addition, when the memory block 110 is a non-selected memory block, the block decoder 130 may output the block selecting signal BLKWL having the negative potential level in response to decoded address signals XA, XB, XC and XD having a low logic level.

The voltage generating circuit 140 may generate and output the plurality of operating voltages to the global word lines G_WL. For example, the operating voltages may include the read voltage having the negative potential level.

FIG. 2 is a circuit diagram illustrating the memory block 110 and the path circuit 120 of the semiconductor memory device 100.

Referring to FIG. 2, the memory block 110 may include a plurality of cell strings ST1 to STm coupled between a common source line CSL and a plurality of bit lines BL1 to BLm. For example, the first cell string ST1 is coupled between the common source line CSL and the first bit line BL1, the second cell string ST2 is coupled between the common source line CSL and the second bit line BL2, and so on and so forth with the $m^{th}$ cell string STm being coupled between the common source line CSL and the mth bit line BLm. The plurality of cell strings ST1 to STm may have the same structure. A first string ST1 may include a source selecting transistor SST, a plurality of memory cells MC0 to MCn and a drain selecting transistor DST coupled in series between the common source line CSL and the bit line BL1. Each of the source selecting transistor SST, the plurality of memory cells MC0 to MCn and the drain selecting transistor DST may be coupled to local word lines L_WL.

The path circuit 120 may be coupled between the global word lines G_WL and local word lines L_WL. The path circuit 120 may include a plurality of high voltage transistors HT1 to HTk to be turned on or off in response to the block selecting signal BLKWL. More specifically, as illustrated in FIG. 2 each transistor HT1 to HTK is coupled between each local word line L_WL and a corresponding global word line GL_WL.

The path circuit 120 may transmit to the memory block 110 or block the plurality of operating voltages generated by the voltage generating circuit in response to the block selecting signal BLKWL provided from the block decoder. For example, during a read operation, when a threshold voltage distribution of programmed memory cells is below 0V, the read voltage having the negative potential level may be provided from the voltage generating circuit 140 to the word lines G_WL.

When the memory block 110 is the selected memory block, the block selecting signal BLKWL having the high potential level may be applied to the path circuit 120, which turns on the plurality of high voltage transistors HT1 to HTk, and thus, the read voltage having the negative potential level may be transmitted to the memory block 110. In addition, when the memory block 110 is the non-selected memory block, the block selecting signal BLKWL having a potential level of a negative voltage may be applied to the path circuit 120, which turns off the plurality of high voltage transistors HT1 to HTk and thus, the path circuit 120 may block the read voltage having the negative potential level from the memory block 110.

FIG. 3 illustrates a first embodiment of the block decoder 130.

Figure 4:
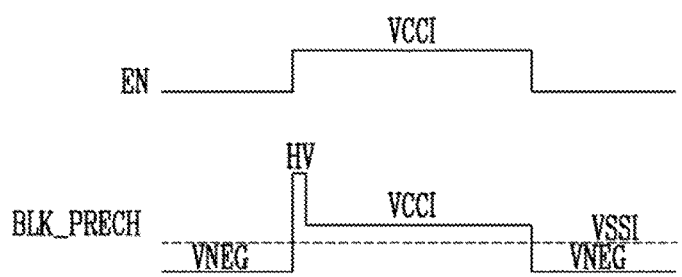
FIG. 4 is a signal waveform diagram illustrating an operation of the block decoder of FIG. 3.

FIG. 4 is a signal waveform diagram illustrating an operation of the block decoder 130 of FIG. 3.

Referring to FIGS. 3 and 4, the block decoder 130 may include a control signal generating circuit 131_A, a potential level switch circuit 132_A and a voltage apply circuit 133_A.

The control signal generating circuit 131_A may include a plurality of NMOS transistors N1 to N5, PMOS transistors P1 and P2, and an inverter IV1. The PMOS transistor P1 may be coupled between nodes A and B. An internal power voltage (VCCI) may be applied to the node A. The PMOS transistor P1 may be turned on or off in response to an enable signal EN. The plurality of NMOS transistors N1 to N5 may be coupled in series between the node B and a ground. A ground voltage VSSI may be applied to the ground. The plurality of NMOS transistors N2 to N5 may be turned or off in response to the decoder address signals XA, XB, XC to XD, respectively.

The NMOS transistor N1 may be turned on or off in response to the enable signal EN. The inverter IV1 may be coupled between the node B and a node C. The inverter IV1 may output an inverted control signal CON_N to the node C by inverting a control signal CON corresponding to a potential level of the node B. The PMOS transistor P2 may be coupled between the nodes A and B. The transistor P2 may be turned on or off in response to the inverted control signal CON_N.

The potential level switch circuit 132_A may include PMOS transistors P3 and P4 and triple well transistors THVN1 to THVN3. The PMOS transistor P3 may be coupled between nodes D and E. The internal power voltage VCCI may be applied to the node D. The PMOS transistor P3 may be turned on or off in response to the control signal CON. The PMOS transistor P4 may be coupled between the node D and a node F. The PMOS transistor P4 may be turned on or off in response to the inverted control signal CON_N. The triple well transistor THVN1 may be coupled between the node E and a node G. A negative voltage VNEG may be applied to the node G. The triple well transistor THVN1 may be turned on or off in response to a potential level of the node F. The triple well transistor THVN2 may be coupled between the nodes F and G. The triple well transistor THVN2 may be turned on or off in response to a potential level of the node E. The triple well transistor THVN3 may be coupled between the node G and a node H. The block selecting signal BLKWL may be output at the node H. The triple well transistor THVN3 may be turned on or off in response to the potential level of the node F.

The voltage apply circuit 133_A may include a depletion transistor DHVN1, a high voltage transistor HVP1 and a triple well transistor THVN4. The depletion transistor DHVN1 and the high voltage transistor HVP1 may be coupled in series between the nodes I and H. A high voltage VBLC may be applied to the node I. The depletion transistor DHVN1 may be turned on or off in response to the potential level of the node H. A threshold voltage of the depletion transistor DHVN1 may have a negative value. When a voltage greater than 0V is applied to the depletion transistor DHVN1, the depletion transistor DHVN1 may be turned on. The high voltage transistor HVP1 may be turned on or off in response to the control signal CON. The high voltage transistor HVP1 may be a PMOS transistor. The triple well transistor THVN4 may be coupled between the nodes C and H, and turned on or off in response to a block precharge signal BLK_PRECH.

Referring to FIGS. 3 and 4, the enable signal EN having the low logic level may be applied to the PMOS transistor P1, and the PMOS transistor P1 may be turned on. As a result, the node B may be initialized to have the potential level of the internal power voltage VCCI. Subsequently, the enable signal EN may be raised to the level of the internal power voltage VCCI.

When the memory block 110 is the selected memory block, the decoded address signals XA, XB, XC and XD of the high logic level may turn on the plurality of NMOS transistors N2 to N5.

Accordingly, the ground voltage VSSI may be applied to the node B and the control signal CON corresponding to the potential level of the node B may have the low logic level. The inverted control signal CON_N may have the high logic level by the inverter IV1. The control signal CON of the low logic level may turn on the PMOS transistor P3 included in the potential level switch circuit 132_A. The internal power voltage VCCI may be output to the node E, and the triple well transistor THVN2 may be turned on in response to the potential level of the node E. The node F may have the voltage level of the negative voltage VNEG, and the triple well transistor THVN3 may stay turned off.

During a predetermined period, the block precharge signal BLK_PRECH of the high voltage HV, which is higher than the internal power voltage VCCI, may be applied to the triple well transistor THVN4. The triple well transistor THVN4 may be turned on so that the inverted control signal CON_N having the low logic level is transferred from the node C to the node H.

After the predetermined period, the block precharge signal BLK_PRECH may drop to the potential level of the internal power voltage VCCI. The depletion transistor DHVN1 may be turned on in response to the potential level of the node H, such that the high voltage VBLC may be output to the high voltage transistor HVP1 through the node I. The control signal CON at the low logic level may be applied to the high voltage transistor HVP1, the high voltage transistor HVP1 may be turned on, and the high voltage VBLC may be transmitted to the node H. Accordingly, as the potential level of the node H increases, an amount of the current flowing through the depletion transistor DHVN1 may increase.

As a result, the potential level of the node H may be increased by the high voltage level VBLC, and the block selecting signal BLKWL having the high voltage level VBLC may be output from the block decoder 130 through the node H. The plurality of operating voltages including the read voltage having the negative potential generated by the voltage generating circuit 140 may be transmitted to the memory block 110 as the selected memory block.

When the memory block 110 is a non-selected memory block, at least one of the decoded address signals XA, XB, XC and XD may have the low logic level and the node B may have the potential level of the internal power voltage VCCI. Therefore, the control signal CON may have the high logic level.

The inverted control signal CON_N may be inverted to the low logic level by the inverter IV1. The inverted control signal CON_N of the low logic level may turn on the PMOS transistor P4 included in the potential level switch circuit 132_A. The internal power voltage VCCI may be transmitted to the node F, which turns on the triple well transistor THVN3. Accordingly, the negative voltage VNEG applied to the node G may be output to the node H through the triple well transistor THVN3. When the memory block 110 is not selected, the block precharge signal BLK_PRECH of the negative voltage VNEG lower than the ground voltage VSSI may be applied to the triple well transistor THVN4 of the voltage apply circuit 133_A. The control signal CON of the high logic level may turn off the high voltage transistor HVP1. The depletion transistor DHVN1 may be turned off by the node H having the negative potential level. The negative voltage VNEG may be output from the block decoder 130 through the node H as the block selecting signal BLKWL. The path circuit 120 may block from the memory block 110 the plurality of operating voltages including the read voltage having the negative potential level generated in the voltage generating circuit 140.

Figure 5:
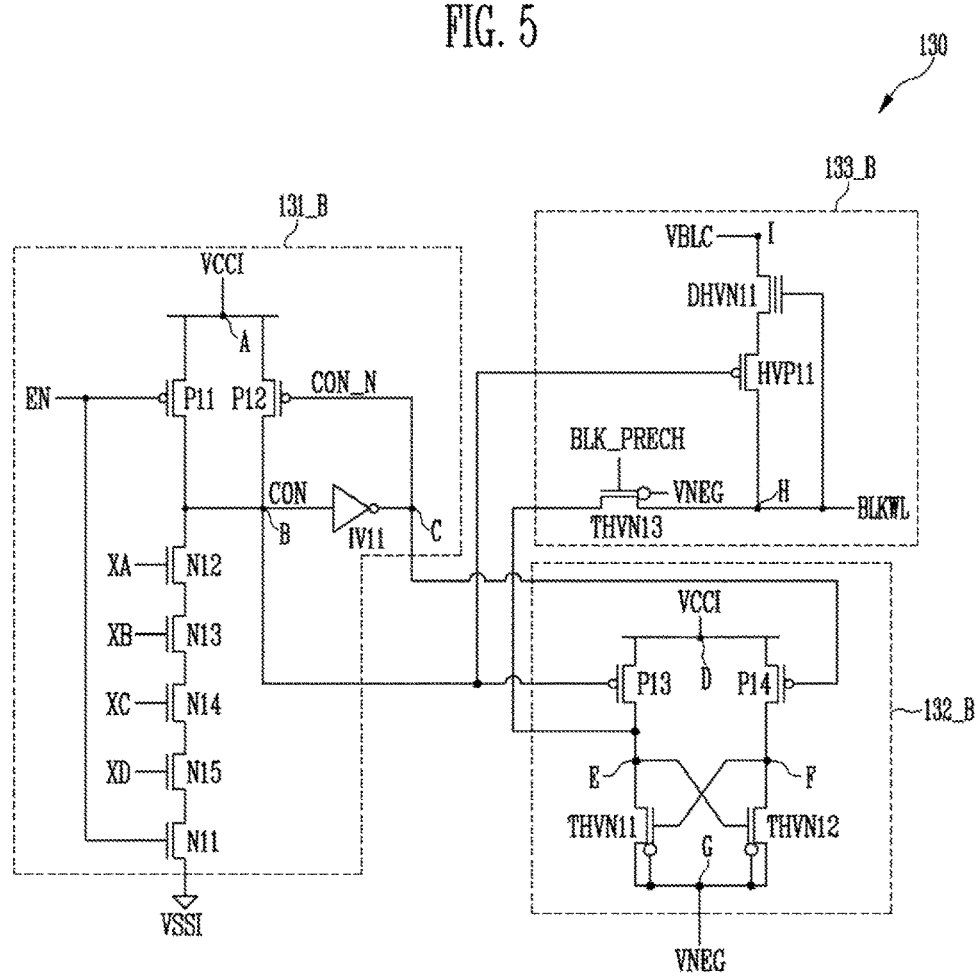
FIG. 5 is a circuit diagram illustrating a block decoder, according to a second embodiment of the present disclosure.

FIG. 5 is a circuit diagram illustrating a block decoder 130 according to a second embodiment.

Figure 6:
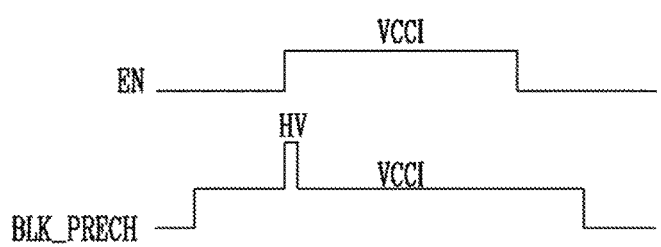
FIG. 6 is a signal waveform illustrating an operation of the block decoder of FIG. 5.

FIG. 6 is a signal waveform diagram illustrating an operation of the block decoder 130 of FIG. 5.

Referring to FIGS. 5 and 6, the block decoder 130 may include a control signal generating circuit 131_B, a potential level switch circuit 132_B and a voltage apply circuit 133_B.

The control signal generating circuit 131_B may include a plurality of NMOS transistors N11 to N15, PMOS transistors P11 and P12 and the inverter IV11. The PMOS transistor P11 may be coupled between nodes A and B. An internal power voltage (VCCI) may be applied to the node A. The PMOS transistor P11 may be turned on or off in response to an enable signal EN. The plurality of NMOS transistors N12 to N15 may be coupled in series between the node B and a ground. A ground voltage VSSI may be applied to the ground. The plurality of NMOS transistors N11 to N15 may be turned on or off in response to the decoded address signals XA, XB, XC and XD.

The NMOS transistor N11 may be turned on or off in response to the enable signal EN. The inverter IV11 may be coupled between the node B and the node C. The inverter IV11 may output the inverted control signal CON_N to the node C by inverting the control signal CON corresponding to the potential level of the node B. The PMOS transistor P12 may be coupled between the nodes A and B. The transistor P2 may be turned on or off in response to the inverted control signal CON_N.

The potential level switch circuit 132_B may include PMOS transistors P13 and P14 and triple well transistors THVN11 and THVN12. The PMOS transistor P13 may be coupled between nodes D and E. The internal power voltage VCCI may be applied to the node D. The PMOS transistor P13 may be turned on or off in response to the control signal CON. The PMOS transistor P14 may be coupled between the node D and a node F. The PMOS transistor P14 may be turned on or off in response to the inverted control signal CON_N. A triple well transistor THVN11 may be coupled between the node E and the node G. A negative voltage VNEG may be applied to the node G. The triple well transistor THVN11 may be turned on or off in response to the potential level of the node F. The triple well transistor THVN12 may be coupled between the nodes F and G. The triple well transistor THVN2 may be turned on or off in response to the potential level of the node E.

The voltage apply circuit 133_B may include a depletion transistor DHVN11, a high voltage transistor HVP11 and a triple well transistor THVN13. The depletion transistor DHVN11 and the high voltage transistor HVP11 may be coupled in series between the nodes I and H. A high voltage VBLC may be applied to the node I. The depletion transistor DHVN11 may be turned on or off in response to the potential level of the node H. A threshold voltage of the depletion transistor DHVN11 may have the negative value. When a voltage greater than 0V is applied to a gate of the depletion transistor DHVN11, the depletion transistor DHVN11 may be turned on. The high voltage transistor HVP11 may be turned on or off in response to the control signal CON. The high voltage transistor HVP11 may be a PMOS transistor. The triple well transistor THVN13 may be coupled between the nodes E and H, and turned on or off in response to the triple well transistor THVN13, and turned on or off in response to the block precharge signal BLK_PRECH.

Referring to FIGS. 5 and 6, the enable signal EN having the low logic level may be applied to the PMOS transistor P11, and the PMOS transistor may be turned on. As a result, the node B may be initialized to have the potential level of the internal power voltage VCCI. Subsequently, the enable signal EN may be raised to the level of the internal power voltage VCCI.

When the memory block 110 is the selected memory block, the decoded address signals XA, XB, XC and XD of the high logic level may turn on the plurality of NMOS transistors N12 to N15.

Accordingly, the ground voltage VSSI may be applied to the node B, and the control signal CON corresponding to the potential level of the node B may be reduced to the logic low level. The inverted control signal CON_N may have the high logic level by the inverter IV11. The control signal CON at the low logic level may be applied to the PMOS transistor P13 included in the potential level switch circuit 132_B, so that the PMOS transistor P13 may be turned on and the internal power voltage VCCI may be output to the node E. The triple well transistor THVN13 may be controlled by the internal power voltage VCCI or the block precharge signal BLK_PRECH having the potential level of the high voltage HV higher than the internal power voltage VCCI.

During the predetermined period, the block precharge signal BLK_PRECH of the high voltage HV may be applied to the triple well transistor THVN13, so that the triple well transistor THVN13 may be turned on. Accordingly, the internal power voltage VCCI output to the node E may be transmitted to the node H.

After the predetermined period, the block precharge signal BLK_PRECH having the internal power voltage VCCI may be applied to the triple well transistor THVN13. The depletion transistor DHVN11 may be turned on in response to the potential level of the node H, and the high voltage VBLC may be output to the high voltage transistor HVP11 through the node I. The control signal CON of the low logic level may be applied to the high voltage transistor HVP11, so that the high voltage transistor HVP11 may be turned on. Accordingly, the high voltage VBLC may be transmitted to the node H. Accordingly, the potential level of the node H may increase, and the amount of the current flowing through the depletion transistor DHVN11 may increase.

As a result, the potential level of the node H may increase by the level of the high voltage VBLC, and the block selecting signal BLKWL having the high voltage level VBLC may be output from the block decoder 130 through the node H. The plurality of operating voltages including the read voltage having the negative potential level generated by the voltage generating circuit 140 may be transmitted to the memory block 110 as the selected memory block.

When the memory block 110 is the non-selected memory block, at least one of the decoded address signals XA, XB, XC and XD may have the low logic level and the node B may have the potential level of the internal power voltage VCCI. Therefore, the control signal CON may have the high logic level.

The inverted control signal CON_N may be inverted to the low logic level by the inverter IV11. The inverted control signal CON_N at the low logic level may turn on the PMOS transistor P14 included in the potential level switch circuit 132_B. The internal power voltage VCCI may be transmitted to the node F, which turns on the triple well transistor THVN11. Accordingly, the negative voltage VNEG applied to the node G may be output to the node E through the triple well transistor THVN11. The triple well transistor THVN13 may be controlled by the internal power voltage VCCI and the block precharge signal BLK_PRECH having the potential level of the high voltage HV higher than the internal power voltage VCCI. The negative voltage VNEG output to the node E may be transmitted to the node H by the triple well transistor THVN13. The control signal CON of the high logic level may turn off the high voltage transistor HVP11. The depletion transistor DHVN11 may be turned off by the node H having the negative potential level. The negative voltage VNEG may be output from the block decoder 130 through the node H as the block selecting signal BLKWL. The path circuit 120 may block from the memory block 110 the plurality of operating voltages including the read voltage having the negative potential level generated in the voltage generating circuit 140.

Such block decoder according to the second embodiment of the present invention may have a smaller number of triple well transistors included in the potential level switch compared to the block decoder according to the first embodiment, and output the block selecting signal having the same the negative potential level as the block decoder according to the first embodiment or the high potential level. As a result, the block decoder and the semiconductor memory device having the same may be reduced in size. In addition, when the internal voltage of the negative potential level or the internal power potential level is output to the voltage apply circuit from the potential level switch circuit, the triple well transistor included in the voltage apply circuit may be controlled by the internal power potential level or the block precharge signal having the potential level higher than the internal power potential level.

Figure 7:
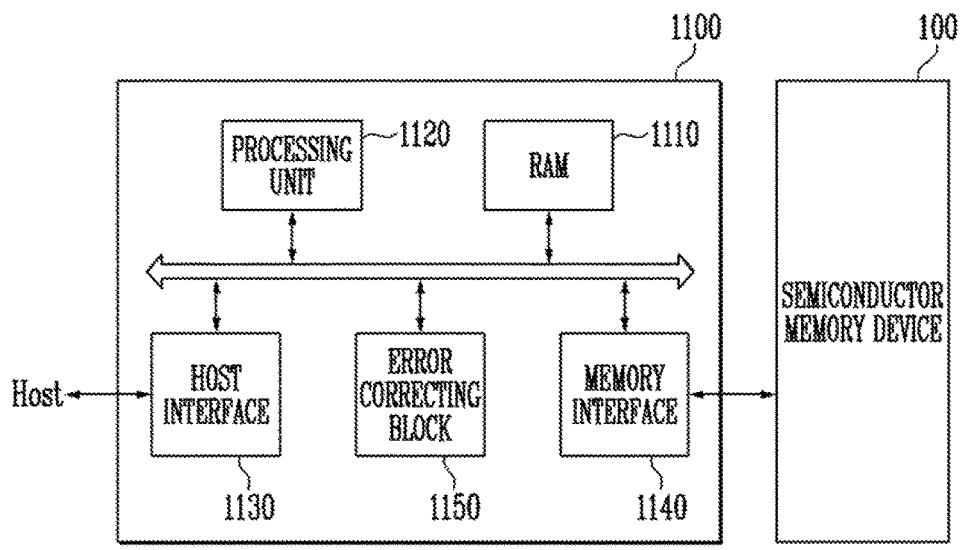
FIG. 7 is a block diagram illustrating a memory system including a semiconductor memory device of FIG. 1, according to an embodiment of the present disclosure.

FIG. 7 illustrates a memory system including a semiconductor memory device of FIG. 1, according to an embodiment of the present disclosure.

Referring to FIG. 7, a memory system 1000 may include the semiconductor memory device 100 and a controller 1100.

The semiconductor memory device 100 may be configured and operate as shown in FIG. 1. Hereafter, the repeated description will be omitted.

The controller 1100 may be coupled to a host and the semiconductor memory device 100. In response to a request from the host, the controller 1100 may be configured to access the semiconductor memory device 100. For example, the controller 1100 may be configured to control a read operation, a write operation, a delete operation, and a background operation of the semiconductor memory device 100. The controller 1100 may be configured to provide interface between the semiconductor memory device 100 and the host. The controller 1100 may be configured to drive firmware to control the semiconductor memory device 100.

The controller 1100 may include a Random Access Memory 1110, a processing unit 1120, host interface 1130, memory interface 1140 and an error correcting block 1150 all being electrically coupled via an internal bus. The RAM 1110 may be used as an operating memory, a cache memory between the semiconductor device 100 and the host, and a buffer memory between the semiconductor memory device 100 and the host. A processing unit 1120 may control various operations of the controller 1100. In addition, the controller 1100 may temporarily store program data provided from the host during the write operation.

A host interface 1130 may include a protocol to perform a data exchange between the host and the controller 1100. As an exemplary embodiment, the controller 1200 may be configured to communicate with the host through at least one of various interface protocols, for example, a universal serial bus (USB) protocol, a multi-media card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface may include a NAND interface or a NOR interface.

An error correcting block 1150 may be configured to detect and correct data errors of the data received from the semiconductor memory device 100 by using an error correcting code (ECC). A processing unit 1120 may control a real voltage in accordance with a result of error detection of the error correcting block 1150, and the semiconductor memory device 100 for performing a re-read operation. As an exemplary embodiment, the error correcting block may be provided as a constituent element of the controller 1100.

The controller 1100 and the semiconductor memory device 100 may be integrated into a signal semiconductor memory device. In an embodiment, the controller 1100 and the semiconductor memory device 100 may be integrated into a single semiconductor memory device, and constitute a memory card. For example, the controller 1100 and the semiconductor memory device 100 may be integrated into a single device and constitute a memory card, for example, a PC card (PCMCIA, personal computer memory card international association), a compact flash card (CF), a smart-media card (SM and SMC), a memory stick card, a multi-media card (MMC, RS-MMC, and MMC micro), a SD card (SD, mini SD, microSD and SDHC), and a universal flash storage device (UFS).

The controller 1100 and the semiconductor memory device 110 may be integrated into a single semiconductor device and constitute a solid state drive (SSD). The solid state drive (SSD) may include a storage device configured to store the data in the semiconductor memory. When the memory system 1000 is used as the solid state drive (SSD), operating speed of the host coupled to a memory system 2000 may be dramatically improved.

The memory system 1000 may be provided as one of the various constituent elements of an electronic device, for example, a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game station, a navigation device, a black box, a digital camera, a 3-dimensional television, a digital audio recorder, a digital audio player, a digital picture recorder, a digital picture player, a digital video recorder, a digital video player, a device transmitting and receiving information in wireless environment, at least one of various electronic devices constituting home network at least one of various electronic devices constituting computer network, at least one of various electronic devices constituting telematics network, a RFID device, or at least various elements constituting the computing system.

As an exemplary embodiment, the semiconductor memory device 100 or the memory system 1000 may be mounted in a variety of packages, including a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), and a wafer-level processed stack package (WSP).

Figure 8:
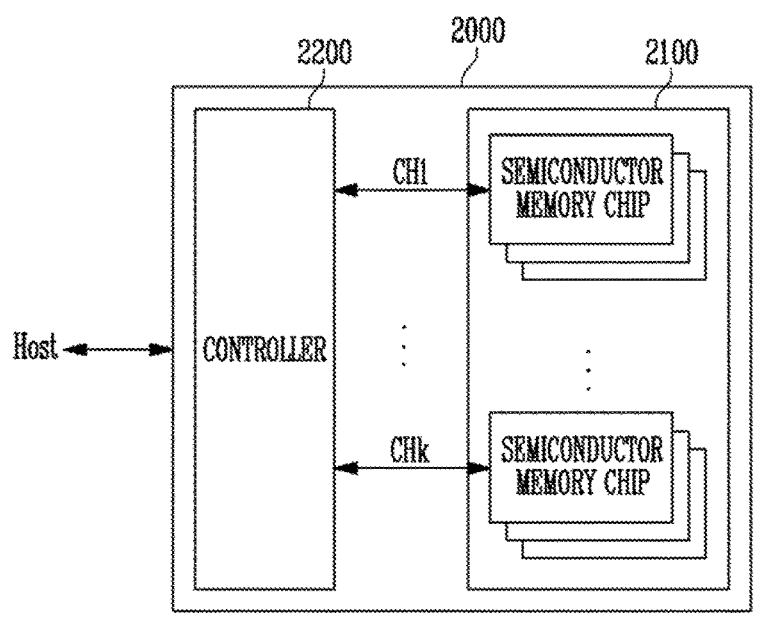
FIG. 8 is a block diagram illustrating an application of a memory system of FIG. 7, according to an embodiment of the present disclosure.

FIG. 8 is a block diagram illustrating an application of a memory system of FIG. 7.

Referring to FIG. 8, the memory system 2000 may include semiconductor memory device 2100 and a controller 2200. The semiconductor memory device 2100 may include a plurality of semiconductor memory chips. The plurality of semiconductor memory chips may be separated into a plurality of groups.

Referring to FIG. 8, it is illustrated that the plurality of groups may communicate with a controller 2200 through a first to a kth channels CH1 to CHk. Each of semiconductor memory chips may be configured and operate as one of the semiconductor memory devices 100 described above referring to FIG. 1.

Each group may be configured to communicate with the controller 2200 through a signal common channel. The controller 2200 may be configured as the controller 1100 described referring to FIG. 7, so the plurality of memory chips of the semiconductor memory device 2100 may be controlled through the plurality of channels CH1 to CHk.

Figure 9:
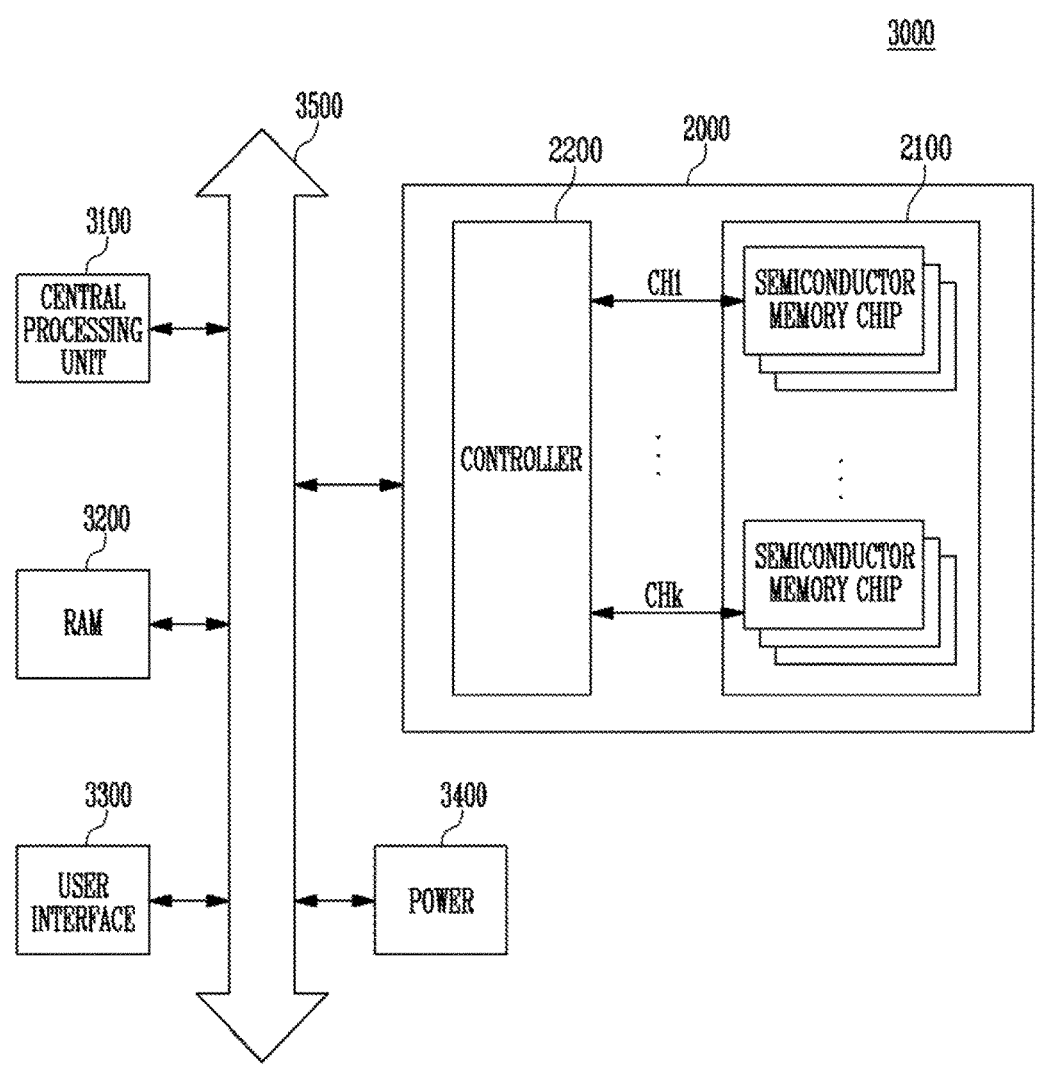
FIG. 9 is a block diagram illustrating a computing system including the memory system of FIG. 8, according to an embodiment of the present disclosure.

FIG. 9 is a block diagram illustrating a computing system including the memory system 2000 of FIG. 8.

Referring to FIG. 9, a computing system 3000 may include a central processing unit 3100, a random access memory (RAM) 3200, user interface 3300, a power 3400, a system bus 3500, and the memory system 2000.

The memory system 2000 may be coupled to the central processing unit 3100, the random access memory (RAM) 3200, the user interface 3300 and the power 3400 through the system bus 3500. The data provided through the user interface 3300 and processed by the central processing unit 3100 may be stored in the memory system 2000.

Referring to FIG. 9, it is illustrated that the computing system 3000 includes a memory device 2100 coupled to the system bus 3500 through the controller 2200. However, the semiconductor memory device 2100 may be configured to be coupled directly to the system bus 3500 in which case the functions of the controller 2200 may be performed by the central processing unit 3100 and the RAM 3200.

Also, we note that the memory system 2000 may be replaced with the memory system 1000 of FIG. 7. As an exemplary embodiment, the computing system 3000 may be configured to include the memory systems 1000 and 2000 described referring to FIGS. 7 and 8.

According to the present disclosure, the number of transistors employed in a block decoder is reduced, thereby reducing the overall size of the semiconductor memory device.

Embodiments of the invention are described with reference to the accompanying Figures in more detail. However, we note, that the technical scope of the present invention is not limited to the detailed description of the specification but is defined the claims. It is further noted that it will be understood by those of skill in the art that various changes in the form and/or in the details may be made without departing from the spirit and scope of the invention as set forth in the following claims.

What is claimed is:

1. A block decoder, comprising:
   a control signal generating circuit suitable for generating a control signal in response to address signals, wherein the control signal has an internal power potential level or a ground voltage level;
   a potential level switch circuit suitable for outputting an internal voltage having the internal power potential level or a negative potential level in response to the control signal, wherein the negative potential level is lower than the ground voltage level; and
   a voltage apply circuit suitable for outputting a block selecting signal having a high potential level higher than the internal power potential level in response to the control signal and the internal voltage having the internal power potential level, when a memory block corresponding to the block selecting signal is selected based on the address signals,
   wherein the block selecting signal has the negative potential level in response to the control signal when the memory block corresponding to the block selecting signal is not selected based on the address signals.

2. The block decoder of claim 1, wherein the potential level switch circuit comprises:
   a first switch coupled between an internal power voltage terminal and a control node, the first switch being suitable for transmitting the internal voltage having the internal power potential level to the control node in response to the control signal;
   a second switch coupled between the internal power voltage terminal and a first node, and suitable for transmitting the internal voltage having the internal power potential level to the first node in response to an inverted control signal that is inverted from the control signal; and a third switch coupled between the control node and a negative voltage terminal, and suitable for transmitting the internal voltage having the negative potential level to the control node in response to the internal voltage having the internal power potential level of the first node.

3. The block decoder of claim 2, wherein the potential level switch circuit further comprises a fourth switch coupled between the first node and the negative voltage terminal, and suitable for transmitting the internal voltage having the negative potential level to the first node in response to the internal voltage having the internal power potential level of the control node.

4. The block decoder of claim 2, wherein the voltage apply circuit comprises a fifth switch electrically connecting the control node to an output node included in the voltage apply circuit, and wherein the fifth switch is controlled by a block precharge signal having the internal power potential level or the high potential level higher than the internal power potential level when the internal voltage having the negative potential level is applied to the control node.

5. The block decoder of claim 4, wherein the fifth switch is controlled by the block precharge signal having the internal power potential level or the high potential level higher than the internal power potential level when the internal voltage having the internal power potential level is applied to the control node.

* * * * *